United States Patent
Jo et al.

(10) Patent No.: US 12,400,852 B2
(45) Date of Patent: Aug. 26, 2025

(54) APPARATUS FOR MANUFACTURING DISPLAY APPARATUS AND METHOD OF MANUFACTURING DISPLAY APPARATUS

(71) Applicants: Samsung Display Co., Ltd., Yongin-si (KR); TES Co., Ltd, Yongin-si (KR); LTC Co., Ltd, Hwaseong-si (KR)

(72) Inventors: Gugrae Jo, Yongin-si (KR); Hyoungsik Kim, Yongin-si (KR); Woojin Cho, Yongin-si (KR); Jongsoon Lee, Hwaseong-si (KR); Hongjae Lee, Yongin-si (KR); Kyusang Kim, Hwaseong-si (KR); Seonjeong Kim, Hwaseong-si (KR); Heejeon Ma, Yongin-si (KR); Wonil Park, Yongin-si (KR); Kicheon Byun, Yongin-si (KR); Woojin Lee, Hwaseong-si (KR)

(73) Assignees: Samsung Display Co., Ltd., Yongin-si (KR); TES CO., LTD, Hwaseong-si (KR); LTC CO., LTD, Hwaseong-si (KR)

( * ) Notice: Subject to any disclaimer, the term of this patent is extended or adjusted under 35 U.S.C. 154(b) by 0 days.

(21) Appl. No.: 18/205,370

(22) Filed: Jun. 2, 2023

(65) Prior Publication Data
US 2023/0395365 A1    Dec. 7, 2023

(30) Foreign Application Priority Data

Jun. 7, 2022    (KR) .................. 10-2022-0069144

(51) Int. Cl.
*H01L 21/02*    (2006.01)
*B08B 5/00*    (2006.01)
(Continued)

(52) U.S. Cl.
CPC ......... *H01L 21/02049* (2013.01); *B08B 5/00* (2013.01); *B08B 7/0014* (2013.01);
(Continued)

(58) Field of Classification Search
None
See application file for complete search history.

(56) References Cited

U.S. PATENT DOCUMENTS

2009/0017627 A1    1/2009   Greeley et al.
2015/0187593 A1    7/2015   Narushima et al.
(Continued)

FOREIGN PATENT DOCUMENTS

CN    110289285 A    9/2019
JP    2017-157660 A    9/2017
(Continued)

OTHER PUBLICATIONS

Extended European Search Report, EP Application No. 23177362.3, dated Nov. 3, 2023, 10 pages.

*Primary Examiner* — Michael E Barr
*Assistant Examiner* — Arlyn I Rivera-Cordero
(74) *Attorney, Agent, or Firm* — Womble Bond Dickinson (US) LLP

(57) ABSTRACT

A method of manufacturing a display apparatus, the method includes removing an oxide layer formed on a surface of a substrate by utilizing a hydrofluoric acid gas and an ammonia gas, and thermally treating the substrate from which the oxide layer has been removed. A flow ratio between the hydrofluoric acid gas and the ammonia gas is about 0.8:1 to about 1:1.

27 Claims, 11 Drawing Sheets

(51) Int. Cl.
  *B08B 7/00*  (2006.01)
  *B08B 7/04*  (2006.01)
  *B08B 13/00*  (2006.01)
  *H10D 86/01*  (2025.01)
  *H10K 59/12*  (2023.01)

(52) U.S. Cl.
  CPC .............. *B08B 7/0071* (2013.01); *B08B 7/04* (2013.01); *B08B 13/00* (2013.01); *H10D 86/0212* (2025.01); *H10K 59/1201* (2023.02)

(56) References Cited

U.S. PATENT DOCUMENTS

| | | | |
|---|---|---|---|
| 2018/0366303 A1* | 12/2018 | Tsuda | H01L 21/02063 |
| 2018/0366337 A1 | 12/2018 | Nakagomi et al. | |
| 2019/0304812 A1* | 10/2019 | Lin | H01L 21/67109 |
| 2020/0243347 A1* | 7/2020 | Tsuda | H01L 21/67069 |
| 2021/0151333 A1 | 5/2021 | Lee et al. | |
| 2022/0301821 A1* | 9/2022 | Saegusa | H01J 37/32477 |

FOREIGN PATENT DOCUMENTS

| | | |
|---|---|---|
| KR | 10-2005-0003144 A | 1/2005 |
| KR | 10-2019-0006777 A | 1/2019 |
| KR | 10-2021-0061155 A | 5/2021 |

* cited by examiner

APPARATUS FOR MANUFACTURING DISPLAY APPARATUS AND METHOD OF MANUFACTURING DISPLAY APPARATUS

CROSS-REFERENCE TO RELATED APPLICATION

This application is claims priority to and the benefit of Korean Patent Application No. 10-2022-0069144, filed on Jun. 7, 2022, in the Korean Intellectual Property Office, the disclosure of which is incorporated by reference herein in its entirety.

BACKGROUND

1. Field

Embodiments of the present disclosure relate to an apparatus for manufacturing a display apparatus and a method of manufacturing a display apparatus.

2. Description of the Related Art

Display apparatuses visually display data. Display apparatuses are utilized as displays of small products, such as mobile phones, or are utilized as displays of large products, such as televisions.

Display apparatuses include a plurality of pixels that receive electrical signals and emit light to display an image to the outside. Each of the plurality of pixels includes a display element. For example, in the case of organic light-emitting display apparatuses, each pixel includes an organic light-emitting diode (OLED) as a display element. In general, organic light-emitting display apparatuses include a thin film transistor and an OLED, which is a display element, formed on a substrate, and the OLED itself emits light.

Applications of display apparatuses have been diversified, and also one or more suitable design efforts for quality improvement of display apparatuses have been made.

SUMMARY

Aspects of embodiments are directed toward an apparatus for manufacturing a display apparatus and a method of manufacturing a display apparatus, by which an oxide layer may be effectively removed without generating impurities, such as a water mark. However, aspects of embodiments according to the disclosure are not limited thereto, and the above characteristics do not limit the scope of embodiments according to the disclosure.

Additional aspects will be set forth in portion in the description which follows and, in part, will be apparent from the description, or may be learned by practice of the presented embodiments of the disclosure.

According to one or more embodiments, a method of manufacturing a display apparatus includes an etching operation of removing an oxide layer formed on a surface of a substrate by utilizing a hydrofluoric acid gas and an ammonia gas, and a thermal treatment operation of thermally treating the substrate from which the oxide layer has been removed. A flow ratio between the hydrofluoric acid gas and the ammonia gas in the etching operation is about 0.8:1 to about 1:1.

The oxide layer may be removed by a salt formation reaction in the etching operation.

The salt may be formed by the salt formation reaction in the etching operation.

The formed salt may be removed by a salt decomposition reaction in the thermal treatment operation.

The etching operation may be performed in a first chamber, and the thermal treatment operation may be performed in a second chamber.

The hydrofluoric acid gas and the ammonia gas may be separately supplied to the first chamber.

A shower head may be arranged within the first chamber, and the hydrofluoric acid gas and the ammonia gas may be mixed within the shower head or directly above the shower head.

A shower head and a lead that covers a top of the shower head and supports a lateral surface of the shower head may be arranged within the first chamber, and the hydrofluoric acid gas and the ammonia gas may be mixed within the lead or mixed between the lead and the shower head.

The etching operation may be performed at a temperature of about 30° C. to about 40° C.

The etching operation may be performed at a process pressure of about 400 mTorr to about 600 mTorr.

The thermal treatment operation may be performed at a temperature of about 150° C. to about 350° C.

According to one or more embodiments, a method of manufacturing a display apparatus includes an etching operation of removing an oxide layer by providing a hydrofluoric acid-ammonia mixture gas to a substrate on which the oxide layer is formed, and a thermal treatment operation of thermally treating the substrate from which the oxide layer has been removed. The thermal treatment operation is performed at a temperature of about 150° C. to about 350° C.

The etching operation may be performed at a temperature of about 30° C. to about 40° C.

The etching operation may be performed at a process pressure of about 400 mTorr to about 600 mTorr.

A flow ratio between the hydrofluoric acid gas and the ammonia gas in the etching operation may be about 0.8:1 to about 1:1.

The hydrofluoric acid gas and the ammonia gas may be separately supplied to the first chamber.

A shower head may be arranged within the first chamber, and the hydrofluoric acid gas and the ammonia gas may be mixed within the shower head or directly above the shower head.

A shower head and a lead that covers a top of the shower head and supports a lateral surface of the shower head may be arranged within the first chamber, and the hydrofluoric acid gas and the ammonia gas may be mixed within the lead or mixed between the lead and the shower head.

The oxide layer may be removed by a salt formation reaction in the etching operation, and a salt may be formed by the salt formation reaction.

The formed salt may be removed by a salt decomposition reaction in the thermal treatment operation.

According to one or more embodiments, an apparatus for manufacturing a display apparatus includes a first chamber in which a substrate is processed, a first supply line that separately supplies a hydrofluoric acid gas and an ammonia gas to the inside of the first chamber, a first shower head configured to spray the hydrofluoric acid gas and the ammonia gas received from the first supply line toward the substrate, a first gas diffusion plate arranged between the first supply line and the first shower head, and a stage on which the substrate is seated.

The first supply line may include a first sub supply line and a second sub supply line, the first sub supply line may supply the hydrofluoric acid gas to the inside of the first chamber, and the second sub supply line may supply the ammonia gas to the inside of the first chamber.

The hydrofluoric acid gas and the ammonia gas may be mixed within the first shower head or directly above the first shower head.

The apparatus may further include a first pressure adjuster configured to adjust an internal pressure of the first chamber.

The apparatus may further include a cooling plate arranged above the stage or under the stage, and an upper heater arranged within the first chamber.

The upper heater may be provided on a top of the first chamber.

The upper heater may heat the hydrofluoric acid gas to a temperature of about 60° C. to about 100° C.

The apparatus may further include a second chamber in which thermal treatment is performed on the substrate, a second supply line configured to supply gases to the second chamber, and a susceptor arranged within the second chamber and configured to support the substrate.

The susceptor may include a heater for heating the substrate.

The susceptor may be provided to be able to move up and down.

These and/or other aspects will become apparent and more readily appreciated from the following description of the embodiments, the claims, and the accompanying drawings.

BRIEF DESCRIPTION OF THE DRAWINGS

The above and other aspects, features, and advantages of certain embodiments of the disclosure will be more apparent from the following description taken in conjunction with the accompanying drawings.

DETAILED DESCRIPTION

Figure 1:
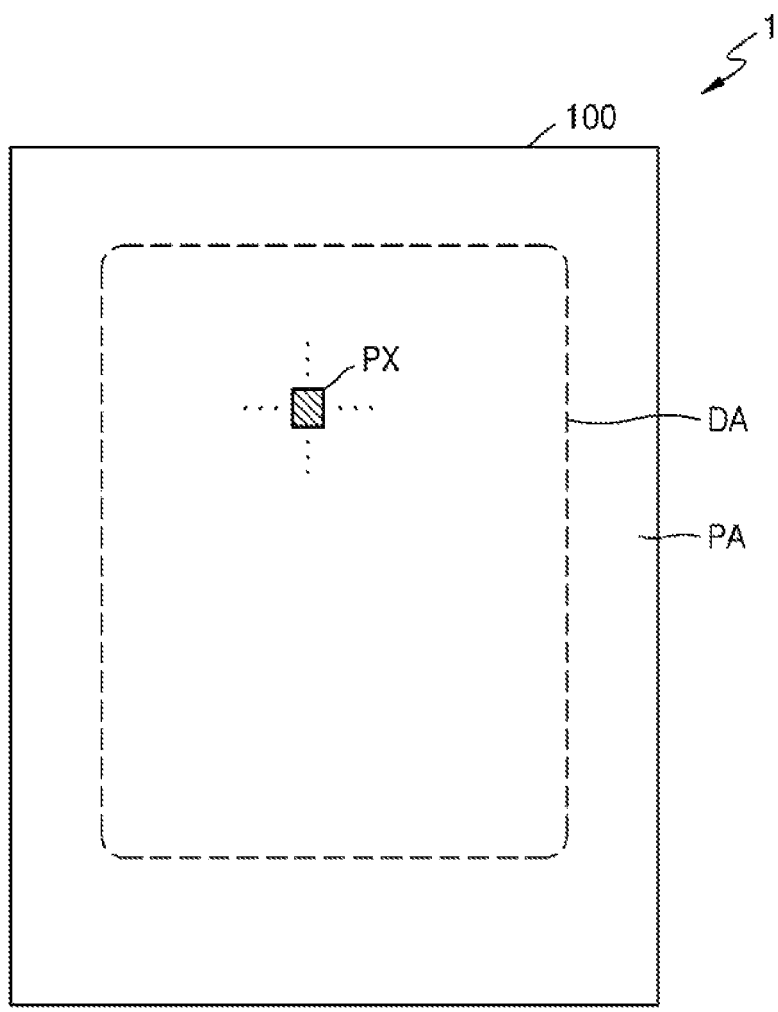
FIG. 1 is a schematic plan view of a display apparatus according to an embodiment.

Reference will now be made in more detail to embodiments, examples of which are illustrated in the accompanying drawings, wherein like reference numerals refer to like elements throughout, and duplicative descriptions thereof may not be provided. In this regard, the present embodiments may have different forms and should not be construed as being limited to the descriptions set forth herein. Accordingly, the embodiments are merely described, by referring to the drawings, to explain aspects of the present description. As utilized herein, the term "and/or" includes any and all combinations of one or more of the associated listed items. Throughout the disclosure, the expression "at least one of a, b or c", "at least one of a, b, and/or c", "at least one selected from among a, b, and c", etc. (three or more item case), indicates only a, only b, only c, both (e.g., simultaneously) a and b, both (e.g., simultaneously) a and c, both (e.g., simultaneously) b and c, all of a, b, and c, or variations thereof.

As the disclosure allows for one or more suitable changes and numerous embodiments, particular embodiments will be illustrated in the drawings and described in more detail in the written description. Hereinafter, effects and features of the disclosure and a method for accomplishing them will be described more fully with reference to the accompanying drawings, in which embodiments of the present disclosure are shown. The disclosure may, however, be embodied in many different forms and should not be construed as limited to the embodiments set forth herein.

It will be understood that although the terms "first," "second," etc. may be utilized herein to describe one or more suitable components, these components should not be limited by these terms. These components are only utilized to distinguish one component from another.

As utilized herein, the singular forms "a," "an," and "the" are intended to include the plural forms as well, unless the context clearly indicates otherwise.

It will be further understood that the terms "comprises" and/or "comprising" utilized herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. For example, for example, intervening layers, regions, or components may be present.

Sizes of elements in the drawings may be exaggerated for convenience of explanation. For example, because sizes and thicknesses of components in the drawings are arbitrarily illustrated for convenience of explanation, the following embodiments are not limited thereto.

In the present specification, "A and/or B" represents A or B, or A and B. The expression "at least one of A and B" (two item case) indicates only A, only B, both (e.g., simultaneously) A and B, or variations thereof.

In the following embodiments, the meaning that a wire extends in a first direction or a second direction encompasses not only extending in a straight line but also extending in zigzags or in a curve in the first direction or the second direction.

In the following embodiments, when referred to "planar", it refers to when an object is viewed from above (e.g., a plan view), and when referred to "sectional", it refers to when a cross section formed by vertically cutting an object is viewed from the side (e.g., a sectional view). In the following embodiments, when referred to "overlapping", it encompasses "planar" overlapping and "cross-sectional" overlapping.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. In contrast, when an element or layer is referred to as being "directly on," "directly connected to", "directly coupled to", or "immediately adjacent to" another element or layer, there are no intervening elements or layers present.

As used herein, the term "substantially," "about," and similar terms are used as terms of approximation and not as terms of degree, and are intended to account for the inherent deviations in measured or calculated values that would be recognized by those of ordinary skill in the art. "About" or "substantially", as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" or "substantially" may mean within one or more standard deviations, or within ±30%, 20%, 10%, 5% of the stated value.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The display apparatus and/or any other relevant devices or components according to embodiments of the present invention described herein may be implemented utilizing any suitable hardware, firmware (e.g. an application-specific integrated circuit), software, or a combination of software, firmware, and hardware. For example, the various components of the device may be formed on one integrated circuit (IC) chip or on separate IC chips. Further, the various components of the [device] may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

One or more embodiments of the disclosure will be described in more detail with reference to the accompanying drawings. Those components that may each independently be the same or are in correspondence are rendered the same reference numeral regardless of the drawing number.

FIG. 1 is a schematic plan view of a display apparatus 1 according to an embodiment.

Referring to FIG. 1, the display apparatus 1 may include a display area DA, where an image is displayed, and a peripheral area PA around (e.g., surrounding) the display area DA. The display apparatus 1 may provide an image to the outside by utilizing light emitted in the display area DA.

A substrate 100 may include glass or polymer resin. According to an embodiment, the substrate 100 may include a flexible material. The flexible material may be a material that is easily bent, curved, folded, or rolled. For example, the flexible material may be formed of ultra-thin glass, metal, or plastic.

Pixels PX including one or more suitable display elements, such as an organic light-emitting diode (OLED), may be located in the display area DA of the substrate 100. A plurality of pixels PX may be included, and the plurality of pixels PX may be arranged in any of one or more suitable patterns, such as a stripe pattern, a PenTile® pattern, or a mosaic pattern, to form an image.

According to an embodiment, in a plan view, the display area DA may have a rectangular shape as shown in FIG. 1. In some embodiments, the display area DA may have a polygonal shape (e.g., a triangular shape, a pentagonal shape, or a hexagonal shape), a circular shape, an elliptical shape, or an irregular shape.

The peripheral area PA of the substrate 100 located around the display area DA may be an area where an image is not displayed. Various wirings for transmitting electric signals to be applied to the display area DA, and pads to which a printed circuit board (PCB) or a driver integrated circuit (IC) chip is attached may be located in the peripheral area PA.

Figure 2:
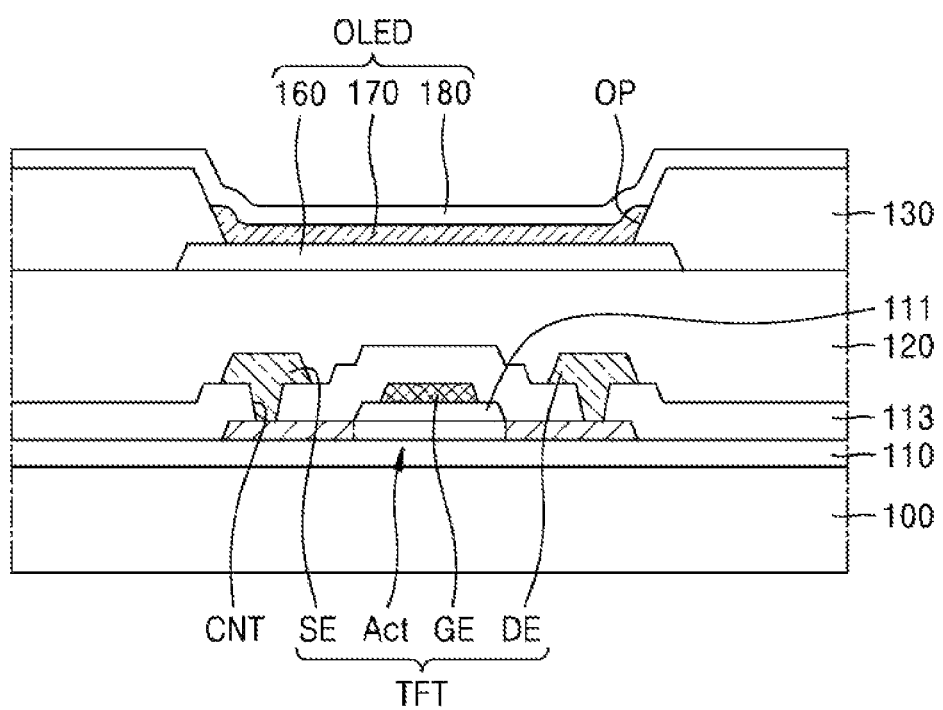
FIG. 2 is a schematic cross-sectional view of a display apparatus according to an embodiment.

FIG. 2 is a schematic cross-sectional view of a display apparatus according to an embodiment.

Referring to FIG. 2, the display apparatus 1 may include the substrate 100, a thin-film transistor TFT, and an organic light-emitting diode OLED.

The substrate 100 may include glass or polymer resin. The polymer resin may include at least one of polyethersulfone, polyarylate, polyetherimide, polyethylene naphthalate, polyethylene terephthalate, polyphenylene sulfide, polyimide, polycarbonate, cellulose triacetate, or cellulose acetate propionate, for example. The substrate 100 may have a structure in which a layer including an organic material and a layer including an inorganic material are alternately stacked. For example, the substrate 100 may include a first base layer, a first barrier layer, a second base layer, and a second barrier layer that are sequentially stacked one on another.

A buffer layer 110 may be arranged on the substrate 100. The buffer layer 110 may reduce or block permeation of foreign materials, moisture, or ambient air from the bottom of the substrate 100. The buffer layer 110 may include an inorganic material, such as silicon oxide, silicon oxynitride, or silicon nitride, and may be a single layer or multiple layers including the aforementioned materials.

The thin-film transistor TFT may be arranged on the buffer layer 110. The thin-film transistor TFT may include a semiconductor layer Act, a gate electrode GE, and a connection electrode. For example, the connection electrode may include a source electrode SE and a drain electrode DE.

According to an embodiment, the semiconductor layer Act may be arranged on the buffer layer 110. The semiconductor layer Act may include a channel region, a source region, and a drain region. The source region and the drain region may be located on both (e.g., simultaneously) sides of the channel region, respectively. The source region and the drain region may be doped with impurities that may include N-type or kind impurities or P-type or kind impurities.

According to an embodiment, the semiconductor layer Act may include at least one of an oxide semiconductor material and/or a silicon semiconductor material. When the semiconductor layer Act includes an oxide semiconductor material, the semiconductor layer Act may include an oxide of at least one of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and/or zinc (Zn). For example, the semiconductor layer Act may include In—Ga—Zn—O (IGZO), In—Sn—Zn—O (ITZO), or In—Ga—Sn—Zn—O (IGTZO) containing a metal, such as In, Ga, or Sn, in ZnO. When the semiconductor layer Act includes a silicon semiconductor material, the semiconductor layer Act may include amorphous silicon or polysilicon.

According to an embodiment, the gate electrode GE may be arranged on the semiconductor layer Act. The gate electrode GE may overlap the semiconductor layer Act with a gate insulating layer 111 therebetween. In other words, the semiconductor layer Act and the gate electrode GE may be insulated from each other by the gate insulating layer 111. The gate electrode GE may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu). The gate electrode GE may be a single layer or a multi-layer including one or more materials.

According to an embodiment, the gate insulating layer 111 may be patterned to overlap a portion of the semiconductor layer Act arranged below the gate insulating layer 111. For example, the gate insulating layer 111 may be patterned such that at least a portion of the source region and/or the drain region of the semiconductor layer Act is exposed. In other words, the gate insulating layer 111 may be patterned to correspond to the channel region of the semiconductor layer Act. The gate insulating layer 111 may be patterned to correspond to the gate electrode GE arranged above the gate insulating layer 111. However, embodiments are not limited thereto. For example, the gate insulating layer 111 may cover the semiconductor layer Act and/or the buffer layer 110.

The gate insulating layer 111 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_x$), and/or the like. The $ZnO_x$ may be zinc oxide (ZnO) and/or zinc peroxide ($ZnO_2$).

According to an embodiment, an interlayer insulating layer 113 may be arranged on the gate electrode GE. The interlayer insulating layer 113 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_x$), and/or the like. The $ZnO_x$ may be zinc oxide (ZnO) and/or zinc peroxide ($ZnO_2$).

According to an embodiment, a contact hole CNT may be defined in the interlayer insulating layer 113. The contact hole CNT defined in the interlayer insulating layer 113 may penetrate through the interlayer insulating layer 113 in a thickness direction of the substrate 100. At least a portion of the semiconductor layer Act may be exposed through the contact hole CNT defined in the interlayer insulating layer 113. The contact hole CNT defined in the interlayer insulating layer 113 may be formed by removing a portion of the interlayer insulating layer 113.

According to an embodiment, a connection electrode may be arranged on the interlayer insulating layer 113. The connection electrode may be a source electrode SE and/or a drain electrode DE. The source electrode SE and/or the drain electrode DE may be electrically connected to the semiconductor layer Act through the contact hole CNT defined in the interlayer insulating layer 113. The source electrode SE and the drain electrode DE may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu). Each of the source electrode SE and the drain electrode DE may be a single layer or a multi-layer including one or more materials. For example, each of the source electrode SE and the drain electrode DE may be a triple layer of titanium/aluminum/titanium (Ti/Al/Ti).

An organic insulating layer 120 may be arranged on the source electrode SE and the drain electrode DE. The organic insulating layer 120 may have a single-layer or multi-layer structure of a layer including an organic material, and provide a flat upper surface. The organic insulating layer 120 may include a commercial polymer, such as benzocyclobutene (BCB), polyimide, hexamethyldisiloxane (HMDSO), polymethyl methacrylate (PMMA) or polystyrene (PS), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, and/or the like.

A light-emitting device OLED may be arranged on the organic insulating layer 120. The light-emitting device OLED may include a first electrode 160, an emission layer 170, and/or a second electrode 180. The first electrode 160 may be an anode, and the second electrode 180 may be a cathode. However, embodiments are not limited thereto.

The first electrode 160 may be arranged on the organic insulating layer 120. In one or more embodiments, the first electrode 160 may be electrically connected to the connection electrode through a via hole defined in the organic insulating layer 120. Accordingly, the thin-film transistor TFT and the light-emitting device OLED may be electrically connected to each other.

The first electrode 160 may be a (semi) light-transmissive electrode or a reflective electrode. According to an embodiment, the first electrode 160 may include a reflective layer formed of silver (Ag), magnesium (Mg), aluminum (Al), platinum (Pt), palladium (Pd), gold (Au), nickel (Ni), neodymium (Nd), iridium (Ir), chromium (Cr), or a compound thereof, and a transparent or semi-transparent electrode layer formed on the reflective layer. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). For example, the first electrode 160 may be a stack structure of ITO/Ag/ITO.

A pixel defining layer 130 having an opening OP through which at least a portion of the first electrode 160 is exposed may be arranged on the first electrode 160. An emission area of light emitted by the light-emitting device OLED may be defined through the opening OP defined in the pixel defining layer 130. For example, the size/width of the opening OP defined in the pixel defining layer 130 may correspond to the size/width of the emission area.

The pixel defining layer 130 may prevent or reduce an electric arc and/or the like from occurring on the edge of the first electrode 160 by increasing a distance between an edge of the first electrode 160 and the second electrode 180 that is over the pixel electrode 160. The pixel defining layer 130 may be formed of at least one organic insulating material selected from among polyimide, polyamide, acryl resin, benzocyclobutene, and a phenolic resin, by utilizing a method, such as spin coating.

The emission layer 170 may be arranged on the first electrode 160. The emission layer 170 may be arranged in the opening OP defined in the pixel defining layer 130. The emission layer 170 may include a low molecular weight or high molecular weight organic material that emits light of a certain color. In some embodiments, the emission layer 170 may include an inorganic insulating material or may include quantum dots.

Although not shown in FIG. 2, a first functional layer may be provided below the emission layer 170, and a second functional layer may be provided on the emission layer 170. The first functional layer may include a hole transport layer (HTL), or may include an HTL and a hole injection layer (HIL). The second functional layer may include an electron transport layer (ETL) and/or an electron injection layer (EIL). However, embodiments are not limited thereto. The first functional layer and/or the second functional layer may be a common layer formed to entirely cover the substrate 100, similar to the second electrode 180 to be described.

In one or more embodiments, the light-emitting device OLED may include a plurality of emission layers 170, and functional layers, such as an HTL, a hole generation layer, an electron generation layer, and/or an ETL, may be arranged between the plurality of emission layers 170.

The second electrode 180 may be arranged on the first electrode 160 and may overlap the first electrode 160. The second electrode 180 may include a conductive material having a low work function. For example, the second electrode 180 may include a (semi)transparent layer including, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy of these materials. In some embodiments, the second electrode 180 may further include a layer, such as ITO, IZO, ZnO, or $In_2O_3$, on the (semi) transparent layer including any of the above-described materials. The second electrode 180 may be integrally formed to entirely cover the substrate 100.

In one or more embodiments, an encapsulation member may be arranged on the light-emitting device OLED. For example, a thin-film encapsulation layer or an encapsulation substrate may be arranged on the light-emitting device OLED. When the thin-film encapsulation layer is arranged on the light-emitting device OLED, the thin-film encapsulation layer may include at least one inorganic layer and at least one organic layer.

Figure 3:
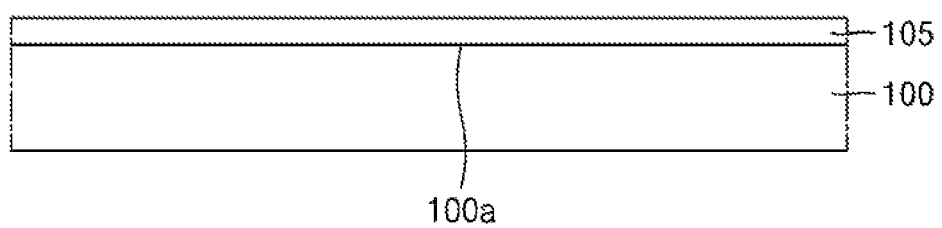
FIGS. 3-5 are cross-sectional views schematically illustrating a method of manufacturing a display apparatus, according to an embodiment.
Figure 4:
Figure 5:
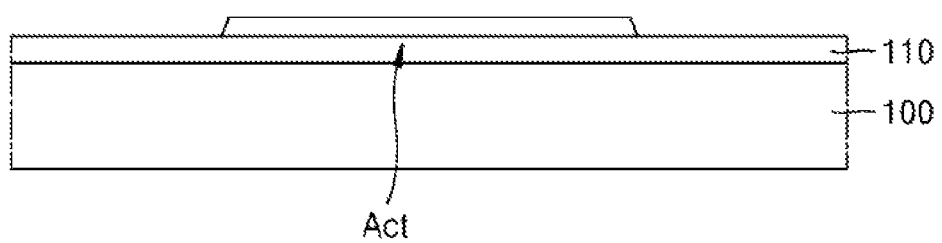

FIGS. 3 through 5 are cross-sectional views schematically illustrating a method of manufacturing a display apparatus, according to an embodiment.

Referring to FIGS. 3 through 5, the method of manufacturing a display apparatus may include an etching operation, a thermal treatment operation, a buffer layer formation operation, and a semiconductor layer formation operation. In the etching operation, an oxide layer 105 formed on a surface 100a of the substrate 100 may be removed using hydrofluoric acid gas and ammonia gas. In the thermal treatment operation, the substrate 100 from which the oxide layer 105 has been removed may be thermally treated. In the operation of forming the buffer layer 110, the buffer layer 110 may be formed on the substrate 100. In the operation of forming the semiconductor layer Act, the semiconductor layer Act may be formed on the buffer layer 110. As another expression, the method of manufacturing a display apparatus may include an etching operation of removing the oxide layer 105 formed on the surface 100a of the substrate 100 by using hydrofluoric acid gas and ammonia gas, a thermal treatment operation of thermally treating the substrate 100 from which the oxide layer 105 has been removed, an operation of forming the buffer layer 110 on the substrate 100, and an operation of forming the semiconductor layer Act on the buffer layer 110.

Referring to FIG. 3, in a process of manufacturing a display apparatus, the oxide layer 105 may be naturally formed on a wafer or the surface 100a of the substrate 100. When the oxide film 105 is present on the surface 100a of the substrate 100, a breakdown voltage may decrease, a leakage current may increase, device characteristics may decrease, and the thickness of a device may be reduced due to the non-uniformity of a thin film.

When the oxide layer 105 formed on the surface 100a of the substrate 100 is removed using a wet cleaning method, impurities, such as a water mark, may be formed on the surface 100a of the substrate 100. Because the display apparatus is weak to moisture or hydrogen, it is difficult to use water or hydrogen to remove the oxide layer 105.

Referring to FIG. 4, according to an embodiment, the etching operation of removing the oxide layer 105 formed on the surface 100a of the substrate 100 by using hydrofluoric acid gas and ammonia gas may be performed. In the etching operation, the oxide layer 105 may be removed by providing a mixture gas (or an etch gas) of hydrofluoric acid gas and ammonia gas to the substrate 100 having the surface 100a on which the oxide layer 105 is formed. In this case, the oxide layer 105 may be removed by a salt formation reaction as follows.

1) $HF + NH_3 \rightarrow NH_4F$ 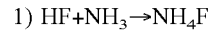
2) $6NH_4F + SiO_2 \rightarrow (NH_4)_2SiF_6 + H_2O + 4NH_3$ 

In other words, the hydrofluoric acid gas and the ammonia gas may chemically react to create ammonium fluoride, and the created ammonium fluoride may react with the oxide layer 105 to form a salt. In this case, the formed salt may be $(NH_4)_2SiF_6$.

According to an embodiment, the etching operation may be performed at a temperature of about 30° C. to about 40° C. In detail, the etching operation may be performed at a process temperature (or a substrate temperature) of about 30° C. to about 40° C. In this case, a substrate temperature may be a temperature of a stage on which a substrate is mounted. When the process temperature (or the substrate temperature) is less than about 30° C., the process temperature (or the substrate temperature) is so low that the efficiency of removing the oxide layer 105 may be reduced. On the other hand, when the process temperature (or the substrate temperature) exceeds about 40° C., the amount of residual fluorine may increase, and thus, the characteristics of a thin-film transistor may degrade or voltage-current characteristics may degrade. Thus, the etching operation may be performed at the process temperature (or the substrate temperature) of about 30° C. to about 40° C., and accordingly, the oxide layer 105 formed on the surface 100a of the substrate 100 may be effectively removed, and the characteristics of the thin-film transistor and the voltage-current characteristics may be improved due to a reduction in the amount of residual fluorine.

According to an embodiment, a flow ratio between the hydrofluoric acid gas and the ammonia gas in the etching operation may be about 0.8:1 to about 1:1. When a flow rate of the hydrofluoric acid gas compared to the ammonia gas increases, the amount of residual fluorine may increase. Thus, when the flow ratio between the hydrofluoric acid gas and the ammonia gas in the etching operation satisfies about to about 1:1, the residual fluorine amount may decrease, and thus, the characteristics of the thin-film transistor and the voltage-current characteristics may be improved.

According to an embodiment, the etching operation may be performed at a process pressure of about 400 mTorr to about 600 mTorr. When the process pressure is less than about 400 mTorr or exceeds about 600 mTorr, the amount of residual fluorine may increase, and thus, the characteristics of the thin-film transistor may degrade or the voltage-current characteristics may degrade. Accordingly, the etching operation is performed at the process pressure of about 400 mTorr to about 600 mTorr, and thus, the amount of residual fluorine may decrease, and consequently, the characteristics of the thin-film transistor and the voltage-current characteristics may be improved.

According to an embodiment, the thermal treatment operation may be performed after the etching operation. In detail, the thermal treatment operation of thermally treating the substrate 100 from which the oxide layer 105 has been removed may be performed after the etching operation of removing the oxide layer 105 formed on the surface 100a of the substrate 100 by utilizing the hydrofluoric acid gas and the ammonia gas.

A salt may be formed by the salt formation reaction in the etching operation, and the salt formed in the etching operation may be removed by a salt decomposition reaction in the thermal treatment operation.

Fluorine existing on the substrate 100 may affect the characteristics of a device formed on the substrate 100 (for example, the characteristics of a thin-film transistor) and may affect a subsequent process. Thus, the amount of fluorine on the substrate 100 may be minimized or reduced.

According to an embodiment, fluorine remaining on the substrate 100 may be removed through the thermal treatment operation. Because the fluorine remaining on the substrate 100 is removed by the thermal treatment operation, device characteristics may be stabilized, and process efficiency may be improved.

The salt formed in the etching operation may be removed by a salt decomposition reaction (or sublimation reaction) as follows.

3) $(NH_4)_2SiF_6 \rightarrow 2NH_3 + SiF_4 + 2HF$

In other words, the salt formed in the etching operation (for example, $(NH_4)_2SiF_6$) may be decomposed to $NH_3$, $SiF_4$, and HF by the salt decomposition reaction (or sublimation reaction).

According to an embodiment, the thermal treatment operation may be performed in a vacuum atmosphere in order to immediately remove materials created through the salt decomposition reaction (or sublimation reaction).

According to an embodiment, the thermal treatment operation may be performed at a temperature of about 150° C. to about 350° C. When the temperature at which the thermal treatment operation is performed is less than about 150° C., the amount of residual fluorine may increase. On the other hand, even when the temperature at which the thermal treatment operation is performed exceeds about 350° C., a degree by which the amount of residual fluorine decreases is not large compared with an increase in the temperature, and thus, process costs may increase and accordingly, process efficiency may decrease. The thermal treatment operation may be performed with respect to a metal layer and an insulating layer, and, when the temperature of the thermal treatment operation exceeds about 350° C., the temperature of the thermal treatment operation may affect device characteristics (for example, thin-film transistor characteristics). Thus, the thermal treatment operation is performed at a temperature of about 150° C. to about 350° C., and accordingly, the salt may be effectively decomposed and process costs may be reduced, leading to an improvement in the process efficiency.

As described above, when the oxide layer 105 is removed using wet etching or liquid (such as pure water) cleaning, impurities, such as watermarks, may be formed. According to an embodiment, the oxide layer 105 is naturally formed on the substrate 100 through dry etching and thermal treatment without wet etching or liquid cleaning, and thus, the oxide layer 105 may be efficiently removed without generating impurities, such as watermarks.

The etching operation may be performed at a low temperature, and the thermal treatment operation may be performed at a relatively high temperature. The etching operation uses hydrofluoric acid gas and ammonia gas, whereas the thermal treatment operation may use only nitrogen gas or inert gas.

According to an embodiment, the etching operation and the thermal treatment operation may be performed in different chambers. For example, the etching operation may be performed in a first chamber, and the thermal treatment operation may be performed in a second chamber. Because the etching operation and the thermal treatment operation are performed in different chambers, respective temperatures in the chambers may be maintained constant, gas that is supplied to the chambers may be easily controlled or selected, and chamber contamination may be minimized or reduced.

Figure 6:
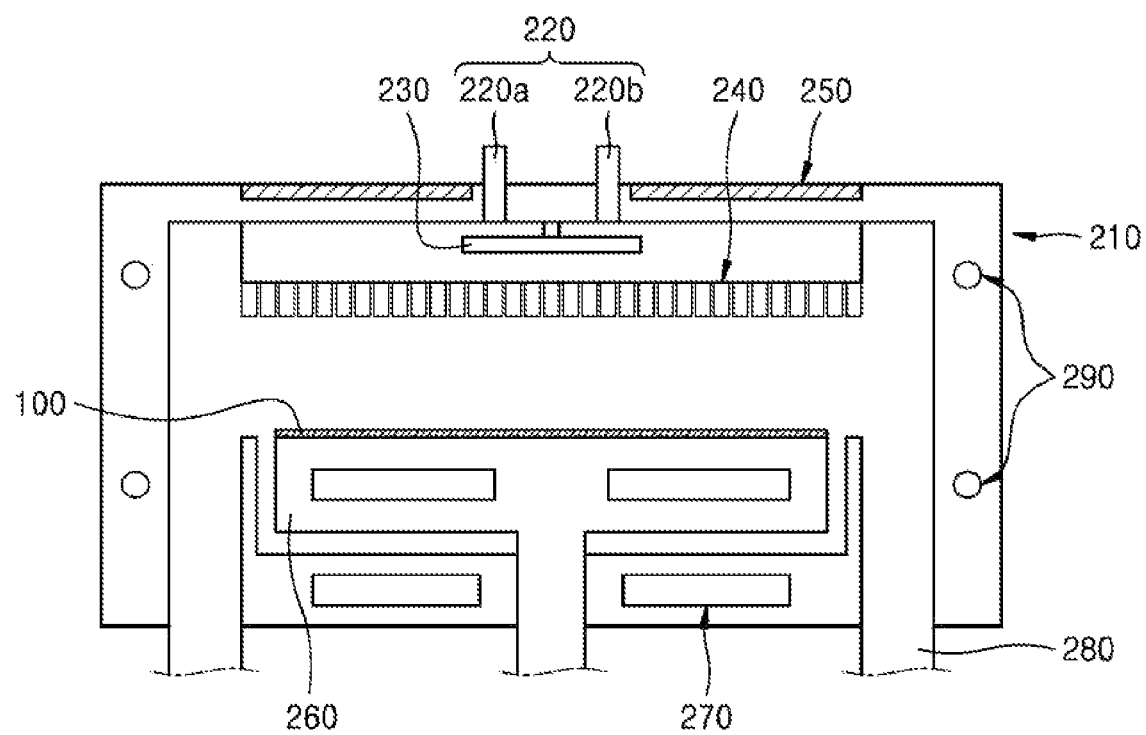
FIGS. 6 and 7 are cross-sectional views schematically illustrating an apparatus for manufacturing a display apparatus, which is utilized in a method of manufacturing a display apparatus, according to an embodiment.
Figure 7:
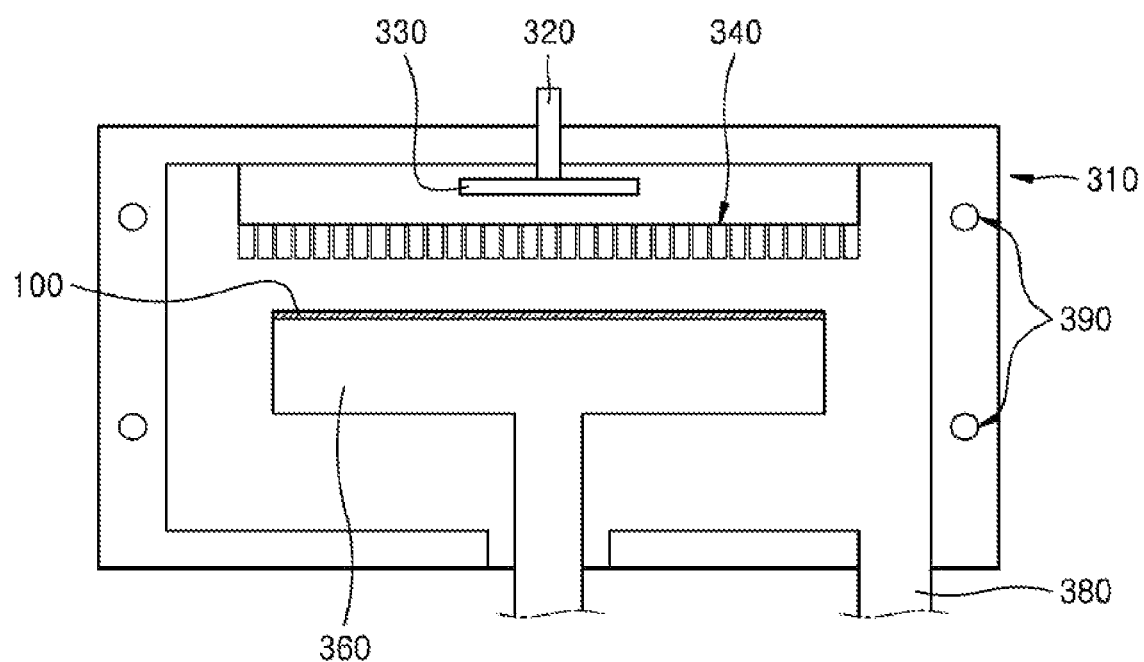

FIGS. 6 and 7 are cross-sectional views schematically illustrating an apparatus for manufacturing a display apparatus, which is used in a method of manufacturing a display apparatus, according to an embodiment. In detail, FIG. 6 is a schematic cross-sectional view of the first chamber of the apparatus for manufacturing a display apparatus, and FIG. 7 is a schematic cross-sectional view of the second chamber of the apparatus for manufacturing a display apparatus. FIGS. 6 and 7 illustrate the first chamber and the second chamber, respectively, and some members thereof may not be provided.

Referring to FIG. 6, the apparatus for manufacturing a display apparatus may include a first chamber 210. In the first chamber 210, a process of processing the substrate 100 may be performed. In more detail, a process of removing an oxide layer formed on a surface of the substrate 100 may be performed in the first chamber 210.

According to an embodiment, the apparatus for manufacturing a display apparatus may include the first chamber 210 and a second chamber 310. The apparatus for manufacturing a display apparatus may include a first supply line 220, a first gas diffusion plate 230, a first shower head 240, an upper heater 250, a stage 260, a cooling plate 270, a first pressure adjuster 280, a first coolant channel 290, a second supply line 320, a second gas diffusion plate 330, a second shower head 340, a susceptor 360, a second pressure adjuster 380, and a second coolant channel 390. In this case, the first supply line 220, the first gas diffusion plate 230, the first shower head 240, the upper heater 250, the stage 260, the cooling plate 270, the first pressure adjuster 280, and the first coolant channel 290 may be included in the first chamber 210, and the second supply line 320, the second gas diffusion plate 330, the second shower head 340, the susceptor 360, the second pressure adjuster 380, and the second coolant channel 390 may be included in the second chamber 310.

According to an embodiment, the first supply line 220 may supply gases to the inside of the first chamber 210. In more detail, the first supply line 220 may supply the hydrofluoric acid gas and the ammonia gas to the inside of the first chamber 210. In this case, the hydrofluoric acid gas and the ammonia gas may be separately supplied to the inside of the first chamber 210.

According to an embodiment, the first supply line 220 may include a first sub supply line 220a and a second sub supply line 220b. The hydrofluoric acid gas and the ammonia gas may be supplied to the inside of the first chamber 210 through different sub supply lines. For example, the hydrofluoric acid gas may be supplied to the inside of the first chamber 210 through the first sub supply line 220a, and the ammonia gas may be supplied to the inside of the second chamber 210 through the second sub supply line 220b. However, embodiments are not limited thereto. The hydrofluoric acid gas and the ammonia gas may be supplied to the inside of the second chamber 210 through the second sub supply line 220b and the first sub supply line 220a, respectively.

According to an embodiment, each of the hydrofluoric acid gas and the ammonia gas may be supplied to the inside of the first chamber 210, together with an inert gas. In this case, the flow rate of the inert gas may be about twice to about five times a flow rate of the hydrofluoric acid gas.

According to an embodiment, the first shower head 240 may be arranged within the first chamber 210. The first shower head 240 may spray the gases supplied through the first supply line 220, toward the substrate 100.

When the hydrofluoric acid gas and the ammonia gas are previously mixed and supplied outside the first chamber 200, etch efficiency may be greatly lowered.

According to an embodiment, to maximally suppress or reduce a reaction between the hydrofluoric acid gas and the ammonia gas, the hydrofluoric acid gas and the ammonia gas supplied to the inside of the first chamber 210 may be mixed within the first shower head 240 or directly above the first shower head 240. The mixing directly above the first shower head 240 refers to a mixture gas being mixed right before being supplied to the first shower head 240.

In one or more embodiments, the first shower head 240, and a lead that covers the top of the first shower head 240 and supports a lateral surface of the first shower head 240 may be arranged within the inside of the first chamber 210. In this case, the hydrofluoric acid gas and the ammonia gas may be separately supplied to the first chamber 210, and may be mixed within the lead or between the lead and the first shower head 240.

According to an embodiment, the first gas diffusion plate 230 may be provided between the first supply line 210 and the first shower head 240. The first gas diffusion plate 230 may allow a mixed etch gas to be evenly distributed. Although not shown in the drawings, when the lead is provided, the first gas diffusion plate 230 may be arranged below the lead.

According to an embodiment, the upper heater 250 may be arranged within the first chamber 210. The upper heater 250 may be arranged on an upper end of the first chamber 210.

The hydrofluoric acid gas, which is a liquefied gas, needs to be heated to a temperature of about 40° C. or more to be able to move in a gas state. In other words, when the hydrofluoric acid gas has a low temperature, the hydrofluoric acid gas may be liquefied and thus may not be supplied to the inside of the first chamber 210.

According to an embodiment, the upper heater 250 arranged on the upper end of the first chamber 210 may heat the hydrofluoric acid gas at a temperature of about 60° C. to about 100° C. When a heating temperature of the upper heater 250 is less than about 60° C., the hydrofluoric acid gas may be liquefied. The heating temperature of the upper heater 250 affects an etch speed and etch uniformity. When the heating temperature of the upper heater 250 exceeds about 100° C., the etch speed may be reduced, and the etch uniformity may degrade. Thus, the heating temperature of the upper heater 250 is about 60° C. to about 100° C., and accordingly, the hydrofluoric acid gas may be prevented or reduced from being liquefied, the etch speed may be prevented or reduced from being reduced, and the etch uniformity may be improved.

According to an embodiment, a stage 260 on which the substrate 100 is seated may be included within the first chamber 210. A cooling plate 270 may be included in the first chamber 210. The cooling plate 270 may be provided above the stage 260 and/or under the stage 260. The cooling plate 270 may lower a temperature of the substrate 100. A substrate temperature in the etching operation may be controlled or selected through the cooling plate 270.

According to an embodiment, a first pressure adjuster 280 for controlling an internal pressure of the first chamber 210 may be included in the first chamber 210. A process pressure in the etching operation may be controlled or selected through the first pressure adjuster 280.

A first coolant channel 290 may be included in the first chamber 210. Because a heat exchange fluid flows through the first coolant channel 290, an internal temperature of the first chamber 210 may be reduced.

According to an embodiment, the second supply line 320 may supply gases to the inside of the second chamber 310. The second shower head 340 may be arranged within the second chamber 310. The second shower head 340 may spray the gases supplied through the second supply line 320, toward the substrate 100.

According to an embodiment, the second gas diffusion plate 330 may be provided between the second supply line 320 and the second shower head 340. The second gas diffusion plate 330 may allow a mixed etch gas to be evenly distributed. Although not shown in the drawings, when the lead is provided, the second gas diffusion plate 330 may be arranged below the lead.

According to an embodiment, the susceptor 360 may be arranged within the second chamber 310. The susceptor 360 may support the substrate 100. The susceptor 360 may maximize or increase heat transfer to the substrate 100 to improve the effects of volatilizing salt reactants and removing residual fluorine components (atoms and ions). The susceptor 360 may include two heating zones (or heaters) for substantially uniform heat distribution.

According to an embodiment, the susceptor 360 may be provided to be able to move up and down. Thus, an interval between the second shower head 340 and the susceptor 360 may be controlled or selected during heat treatment. Accordingly, an interval between the second shower head 340 and the substrate 100 may be controlled or selected. Because the interval between the second shower head 340 and the substrate 100 is controlled or selected through the susceptor 360, a pressure and a flow rate transmitted to the substrate 100 may be controlled or selected, leading to an improvement in process efficiency. In other words, the hourly output of the second chamber 310 may be improved.

According to an embodiment, a second pressure adjuster 380 for controlling an internal pressure of the second chamber 310 may be included in the second chamber 310. A process pressure in the thermal treatment operation may be controlled or selected through the second pressure adjuster 380. According to an embodiment, the internal pressure of the second chamber 310 may be 0.1 Torr to 10 Torr. The internal pressure of the second chamber 310 may be adjusted utilizing a gas, such as argon gas or nitrogen gas.

A second coolant channel 390 may be included in the second chamber 310. Because a heat exchange fluid flows through the second coolant channel 390, an internal temperature of the second chamber 310 may be reduced.

A result of testing the amount of fluorine remaining on a substrate according to an etching process condition and a thermal treatment temperature condition is shown. Because residual fluorine may adversely affect transistor characteristics, voltage-current characteristics, and/or the like, the residual fluorine may be kept as low as possible.

The amount of residual fluorine was measured using ion chromatography equipment. A method of measuring the amount of residual fluorine by ion chromatography is measuring the amount of fluorine dissolved in water, and is a suitable method of detecting the amount of fluorine distributed over a large area.

The residual fluorine amount of the substrate that has undergone both (e.g., simultaneously) of the etching operation and the thermal treatment operation was measured.

Figure 8:
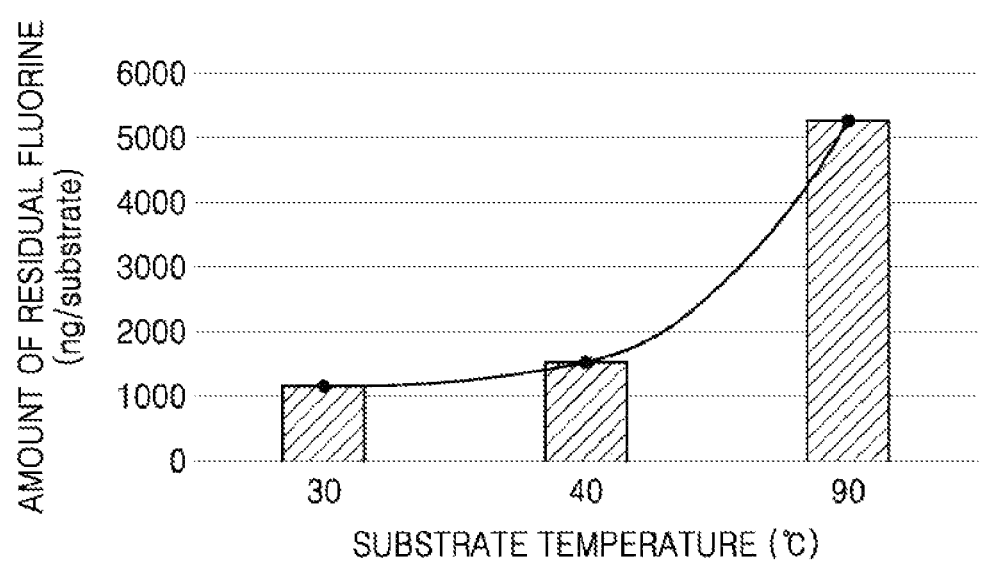
FIG. 8 is a graph showing a residual fluorine amount measurement result versus a substrate temperature in an etching operation, according to an embodiment.

FIG. 8 is a graph showing a residual fluorine amount measurement result versus a substrate temperature in the etching operation. In FIG. 8, process conditions other than the substrate temperature were fixed, and are as follows. In this case, the substrate temperature may be a temperature of a stage on which a substrate is mounted.
1) HF:NH$_3$ flow ratio=0.8:1
2) HF:Ar flow ratio=1:2.5
3) process pressure: 400 mTorr
4) thermal treatment temperature: 350° C.

Referring to FIG. 8, when the substrate temperature in the etching operation is about 30° C. and about 40° C., the amount of residual fluorine is relatively low, compared with when the substrate temperature is about 90° C. When the substrate temperature is less than about 30° C., the substrate temperature is so low that the efficiency of removing the oxide layer 105 may be reduced. Thus, when the substrate temperature satisfies about 30° C. to about 40° C., the oxide layer 105 may be effectively removed, and the characteristics of the thin-film transistor and the voltage-current characteristics may be improved due to a reduction in the amount of residual fluorine.

Figure 9:
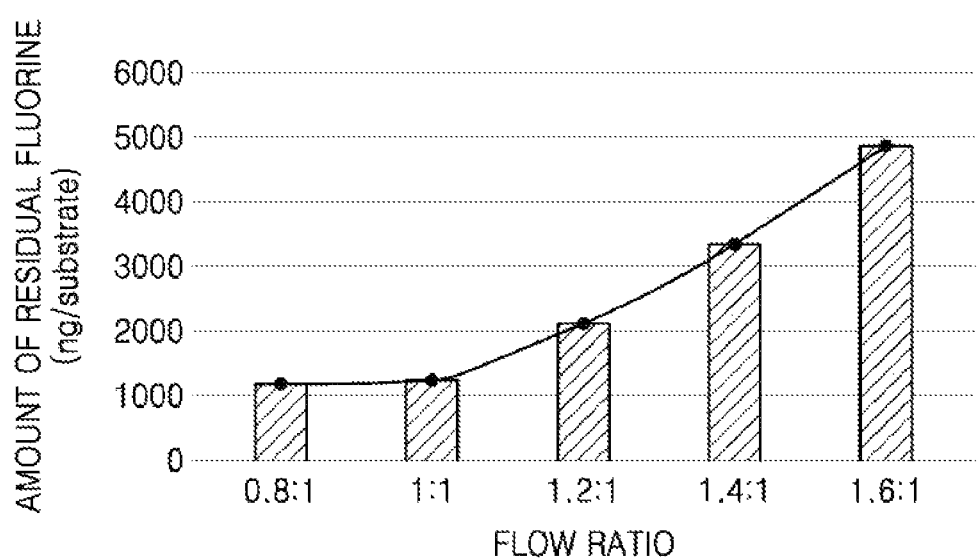
FIG. 9 is a graph showing a residual fluorine amount measurement result versus a flow ratio between a fluorine gas and an ammonia gas in the etching operation, according to an embodiment.

FIG. 9 is a graph showing a residual fluorine amount measurement result versus a flow ratio between a fluorine gas and an ammonia gas in the etching operation. In FIG. 9, process conditions other than the flow ratio between a fluorine gas and an ammonia gas were fixed, and are as follows.
1) HF:Ar flow ratio=1:2.5
2) process pressure: 400 mTorr
3) substrate temperature in the etching operation: 30° C.
4) thermal treatment temperature: 350° C.

Referring to FIG. 9, it may be seen that, when the flow rate of the hydrofluoric acid gas among the hydrofluoric acid gas and the ammonia gas increases in the etching operation (when the percentage of the hydrofluoric acid gas increases), the amount of residual fluorine increases. However, it may be seen that, when the flow ratio between the hydrofluoric acid gas and the ammonia gas in the etching operation is 0.8:1 and 1:1, the amount of residual fluorine is relatively low, compared with when the flow ratio between the hydrofluoric acid gas and the ammonia gas in the etching operation is 1.2:1 or greater. According to an embodiment, the flow ratio between the hydrofluoric acid gas and the ammonia gas in the etching operation may be 0.8:1 to 1.2:1. The flow ratio between the hydrofluoric acid gas and the ammonia gas in the etching operation may be 0.8:1 to 1:1. When the flow ratio between the hydrofluoric acid gas and the ammonia gas in the etching operation satisfies the aforementioned condition, the amount of residual fluorine remaining on the substrate 100 may be reduced, and thus the characteristics of the thin-film transistor and the voltage-current characteristics may be improved.

Figure 10:
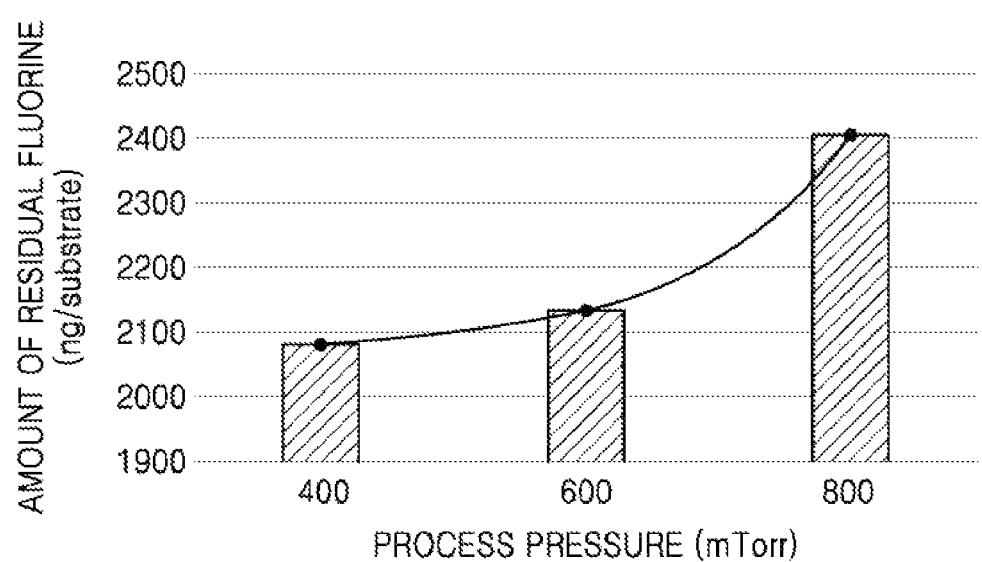
FIG. 10 is a graph showing a residual fluorine amount measurement result versus a process pressure in the etching operation, according to an embodiment.

FIG. 10 is a graph showing a residual fluorine amount measurement result versus a process pressure in the etching operation. In FIG. 10, process conditions other than the process pressure were fixed, and are as follows.
1) HF:NH$_3$ flow ratio=0.8:1
2) HF:Ar flow ratio=1:3
3) substrate temperature in the etching operation: 30° C.
4) thermal treatment temperature: 350° C.

Referring to FIG. 10, it may be seen that, when the process pressure in the etching operation increases, the amount of residual fluorine increases. However, when the process pressure is about 400 mTorr and about 600 mTorr, the amount of residual fluorine is relatively low, compared with when the process pressure is about 800 mTorr. According to an embodiment, the process pressure in the etching operation may be about 400 mTorr to about 600 mTorr. When the process pressure in the etching operation satisfies the aforementioned condition, the amount of residual fluorine remaining on the substrate 100 may be reduced, and thus the characteristics of the thin-film transistor and the voltage-current characteristics may be improved.

Figure 11:
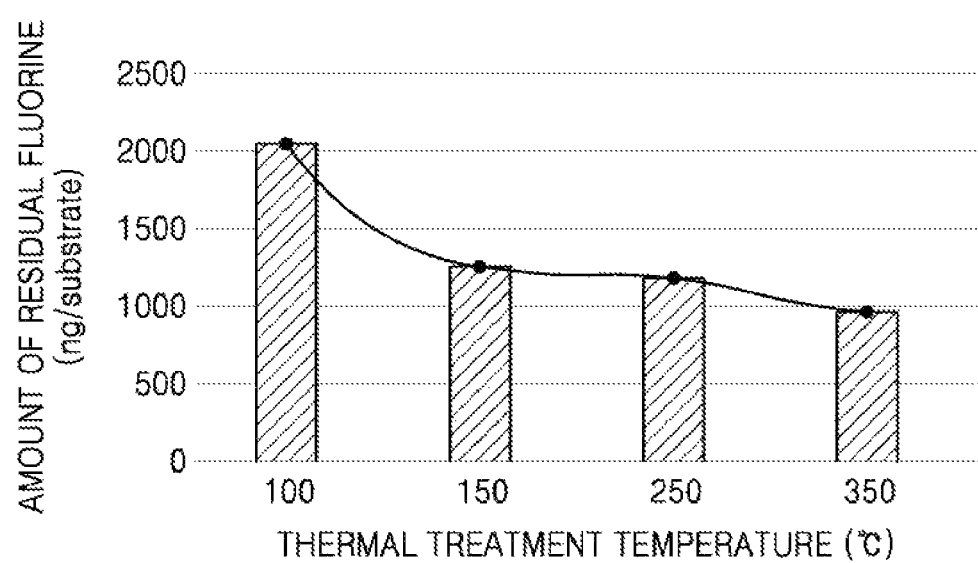
FIG. 11 is a graph showing a residual fluorine amount measurement result versus a thermal treatment temperature in a thermal treatment operation, according to an embodiment.

FIG. 11 is a graph showing a residual fluorine amount measurement result versus a thermal treatment temperature in the thermal treatment operation. In FIG. 11, process conditions other than the thermal treatment temperature in the thermal treatment operation were fixed, and are as follows.

1) $HF:NH_3$ flow ratio=0.8:1
2) HF:Ar flow ratio=1:2.5
3) process pressure: 400 mTorr
4) substrate temperature in the etching operation: 30° C.
5) thermal treatment chamber pressure: 2000 mTorr Referring to FIG. 10, it may be seen that, when the thermal treatment temperature in the thermal treatment operation increases, the amount of residual fluorine decreases. It may also be seen that the amount of residual fluorine when the thermal treatment temperature is about 150° C. is greatly low compared with the amount of residual fluorine when the thermal treatment temperature is about 100° C. In other words, when the thermal treatment temperature increases from about 100° C. to about 150° C., the amount of residual fluorine may be significantly reduced. The thermal treatment operation may be performed with respect to a metal layer and an insulating layer, and, when the temperature of the thermal treatment operation exceeds about 350° C., the temperature of the thermal treatment operation may affect thin-film transistor characteristics. According to an embodiment, the thermal treatment temperature in the thermal treatment operation may be about 150° C. to about 350° C. When the thermal treatment temperature in the thermal treatment operation satisfies the aforementioned condition, the amount of residual fluorine may be reduced, and a change in the thin-film transistor characteristics may be prevented, minimized, or reduced.

According to an embodiment, the surface of the substrate 100 before the etching operation is performed is hydrophilic, but the surface of the substrate 100 after the etching operation is performed may have hydrophobicity. For example, a contact angle of the surface of the substrate 100 before the etching operation is performed with respect to water was measured to be about 31.5°, but a contact angle of the surface of the substrate 100 after the etching operation is performed with respect to water was measured to be about 106.5°. At this time, the contact angle of the surface of the substrate 100 after the etching operation is performed was measured after the thermal treatment operation. Thus, it may be seen that the oxide layer 105 formed on the substrate 100 is removed through the etching operation.

Referring back to FIG. 5, after the oxide layer 105 formed on the substrate 100 is removed through the etching operation and the thermal treatment operation, the buffer layer 110 and the semiconductor layer Act may be formed on the substrate 100.

According to an embodiment, the buffer layer 110 may be formed on the substrate 100, and the semiconductor layer Act may be formed on the buffer layer 110.

In one or more embodiments, the gate insulating layer 111 of FIG. 2 may be formed on the semiconductor layer Act, and the gate electrode GE of FIG. 2 may be formed on the gate insulating layer 111. Thereafter, the interlayer insulating layer 113 of FIG. 2 may be formed on the gate electrode GE, the connection electrode may be formed on the interlayer insulating layer 113, the organic insulating layer 120 of FIG. 2 may be formed on the connection electrode, the first electrode 160 of FIG. 2, and the light-emitting device OLED of FIG. 2 including the emission layer 170 of FIG. 2, and the second electrode 180 of FIG. 2 may be formed on the organic insulating layer 120.

According to an embodiment, the oxide layer 105 formed on the substrate 100 may be removed through the etching operation (for example, a dry etching operation). At this time, the oxide layer 105 may be removed through a salt formation reaction, and a salt may be formed as a by-product.

The formed salt and the residual fluorine component may be removed through the thermal treatment operation. In detail, the salt formed in the etching operation and the residual fluorine component present on the substrate 100 may be removed through the thermal treatment operation. Thus, the oxide layer 105 formed on the substrate 100 may be effectively removed through the etching operation (for example, a dry etching operation) and the thermal treatment operation, without creating impurities, such as water marks.

According to an embodiment as described above, provided are an apparatus and method of manufacturing a display apparatus, by which an oxide layer formed on a substrate may be removed using a hydrofluoric acid-ammonia mixture gas. Of course, the scope of the disclosure is not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by those of ordinary skill in the art that one or more suitable changes in form and details may be made therein without departing from the spirit and scope as defined by the following claims and equivalents thereof.

What is claimed is:

1. A method of manufacturing a display apparatus, the method comprising:
    removing an oxide layer by providing a hydrofluoric acid-ammonia mixture gas to a substrate on which the oxide layer is formed; and
    thermally treating the substrate from which the oxide layer has been removed,
    wherein the removing of the oxide layer is performed at a process pressure of about 400 mTorr to about 600 mTorr, and
    wherein the thermally treating of the substrate is performed at a temperature of about 150° C. to about 350° C.

2. The method of claim 1, wherein the removing of the oxide layer is performed at a temperature of about 30° C. to about 40° C.

3. The method of claim 1, wherein the oxide layer is removed by a salt formation reaction during the removing of the oxide layer, and
    a salt is formed by the salt formation reaction.

4. The method of claim 3, wherein the formed salt is removed by a salt decomposition reaction during the thermally treating of the substrate.

5. The method of claim 1, wherein a flow ratio between a hydrofluoric acid gas and an ammonia gas is about 0.8:1 to about 1:1.

6. The method of claim 5, wherein the hydrofluoric acid gas and the ammonia gas are separately supplied to a first chamber.

7. The method of claim 6, wherein
    a shower head is arranged within the first chamber, and
    the hydrofluoric acid gas and the ammonia gas are mixed within the shower head or mixed before being supplied to the shower head.

8. The method of claim 6, wherein a shower head and a lead that covers a top of the shower head and supports a lateral surface of the shower head are arranged within the first chamber, and the hydrofluoric acid gas and the ammonia gas are mixed within the lead or mixed after being supplied within the lead and before being supplied to the shower head.

9. A method of manufacturing a display apparatus, the method comprising:

removing an oxide layer formed on a surface of a substrate by utilizing a hydrofluoric acid gas and an ammonia gas; and thermally treating the substrate from which the oxide layer has been removed, wherein a flow ratio between the hydrofluoric acid gas and the ammonia gas is about 0.8:1 to about 1:1, and wherein the removing of the oxide layer is performed at a process pressure of about 400 m Torr to about 600 m Torr.

10. The method of claim 9, wherein the removing of the oxide layer is performed at a temperature of about 30° C. to about 40° C.

11. The method of claim 9, wherein the thermally treating of the substrate is performed at a temperature of about 150° C. to about 350° C.

12. The method of claim 9, wherein the oxide layer is removed by a salt formation reaction during the removing of the oxide layer.

13. The method of claim 12, wherein a salt is formed by the salt formation reaction during the removing of the oxide layer.

14. The method of claim 13, wherein the formed salt is removed by a salt decomposition reaction during the thermally treating of the substrate.

15. The method of claim 9, wherein the removing of the oxide layer is performed in a first chamber, and the thermally treating of the substrate is performed in a second chamber.

16. The method of claim 15, wherein the hydrofluoric acid gas and the ammonia gas are separately supplied to the first chamber.

17. The method of claim 16, wherein a shower head is arranged within the first chamber, and the hydrofluoric acid gas and the ammonia gas are mixed within the shower head or mixed before being supplied to the shower head.

18. The method of claim 16, wherein a shower head and a lead that covers a top of the shower head and supports a lateral surface of the shower head are arranged within the first chamber, and the hydrofluoric acid gas and the ammonia gas are mixed within the lead or mixed after being supplied within the lead and before being supplied to the shower head.

19. An apparatus for manufacturing a display apparatus, the apparatus comprising:

a first chamber configured to remove an oxide layer formed on a surface of a substrate;

a first supply line that separately supplies a hydrofluoric acid gas and an ammonia gas to an inside of the first chamber;

a first shower head configured to spray the hydrofluoric acid gas and the ammonia gas received from the first supply line toward the substrate;

a first gas diffusion plate arranged between the first supply line and the first shower head;

a stage on which the substrate is seated; and a first pressure adjuster configured to adjust an internal pressure of the first chamber to have a process pressure of about 400 mTorr to about 600 mTorr during the removing of the oxide layer, wherein the apparatus is configured to mix the hydrofluoric acid gas and the ammonia gas the inside the first chamber.

20. The apparatus of claim 19, wherein the first supply line comprises a first sub supply line and a second sub supply line, and the first sub supply line is configured to supply the hydrofluoric acid gas to the inside of the first chamber, and the second sub supply line is configured to supply the ammonia gas to the inside of the first chamber.

21. The apparatus of claim 20, wherein the apparatus is configured to mix the hydrofluoric acid gas and the ammonia gas within the first shower head or directly above the first shower head.

22. The apparatus of claim 19, further comprising:

a cooling plate arranged above the stage or under the stage; and an upper heater arranged within the first chamber.

23. The apparatus of claim 22, wherein the upper heater is provided on a top of the first chamber.

24. The apparatus of claim 23, wherein the upper heater heats the hydrofluoric acid gas to a temperature of about 60° C. to about 100° C.

25. The apparatus of claim 19, further comprising:

a second chamber configured to thermally treat the substrate therein;

a second supply line configured to supply gases to the second chamber; and a susceptor arranged within the second chamber and configured to support the substrate.

26. The apparatus of claim 25, wherein the susceptor comprises a heater configured to heat the substrate.

27. The apparatus of claim 26, wherein the susceptor is further configured to move up and down.

* * * * *